United States Patent
Kaim et al.

(10) Patent No.: US 9,012,874 B2
(45) Date of Patent: *Apr. 21, 2015

(54) METHOD AND APPARATUS FOR ENHANCED LIFETIME AND PERFORMANCE OF ION SOURCE IN AN ION IMPLANTATION SYSTEM

(71) Applicant: Entegris, Inc., Billerica, MA (US)

(72) Inventors: Robert Kaim, Brookline, MA (US); Joseph D. Sweeney, New Milford, CT (US); Anthony M. Avila, Austin, TX (US); Richard S. Ray, New Milford, CT (US)

(73) Assignee: Entegris, Inc., Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/338,132

(22) Filed: Jul. 22, 2014

(65) Prior Publication Data

US 2014/0326896 A1 Nov. 6, 2014

Related U.S. Application Data

(63) Continuation of application No. 13/840,961, filed on Mar. 15, 2013, now Pat. No. 8,785,889, which is a continuation of application No. 13/567,571, filed on Aug. 6, 2012, now Pat. No. 8,399,865, which is a (Continued)

(51) Int. Cl.
*H01J 37/317* (2006.01)
*H01L 21/265* (2006.01)

(Continued)

(52) U.S. Cl.
CPC ............ *H01J 37/08* (2013.01); *H01J 37/3171* (2013.01); *H01J 2237/022* (2013.01);

(Continued)

(58) Field of Classification Search
CPC .. H01J 2237/022; H01J 37/08; H01J 37/3171
USPC .................. 250/492.21, 423 R, 492.3, 493.1; 315/111.81, 111.91; 427/523
See application file for complete search history.

(56) References Cited

U.S. PATENT DOCUMENTS

| 4,331,647 A | 5/1982 | Goldenberg |
| 4,348,376 A | 9/1982 | Goldenberg |

(Continued)

FOREIGN PATENT DOCUMENTS

| EP | 0079705 A1 | 5/1983 |
| EP | 0656668 B1 | 3/1999 |

(Continued)

OTHER PUBLICATIONS

Advanced Technology Materials, Inc., "VAC GeF4 Isotopically Enriched: Materials: VAC Delivery Package Germanium Tetrafluoride", 2005, pp. 1-2 (Best Available Copy), Published in: Danbury, CT.

(Continued)

*Primary Examiner* — Nikita Wells
(74) *Attorney, Agent, or Firm* — Hultquist, PLLC; Steven J. Hultquist; Rosa Yaghmour

(57) ABSTRACT

An ion implantation system and process, in which the performance and lifetime of the ion source of the ion implantation system are enhanced, by utilizing isotopically enriched dopant materials, or by utilizing dopant materials with supplemental gas(es) effective to provide such enhancement.

25 Claims, 2 Drawing Sheets

Related U.S. Application Data continuation of application No. 13/401,527, filed on Feb. 21, 2012, now Pat. No. 8,237,134, which is a continuation of application No. PCT/US2011/026388, filed on Feb. 26, 2011.

(60) Provisional application No. 61/308,428, filed on Feb. 26, 2010, provisional application No. 61/390,715, filed on Oct. 7, 2010.

(51) Int. Cl.
*H01J 37/08* (2006.01)
*F17C 7/00* (2006.01)
*H01J 37/30* (2006.01)

(52) U.S. Cl.
CPC ............ *H01J 2237/304* (2013.01); *F17C 7/00* (2013.01); *H01L 21/26506* (2013.01); *Y02E 60/321* (2013.01); *H01J 37/3002* (2013.01)

(56) References Cited

U.S. PATENT DOCUMENTS

| | | | |
|---|---|---|---|
| 4,657,774 A | 4/1987 | Satou et al. | |
| 4,658,143 A | 4/1987 | Tokiguchi et al. | |
| 4,680,358 A | 7/1987 | Yu | |
| 4,722,978 A | 2/1988 | Yu | |
| 4,803,292 A | 2/1989 | Ohfune et al. | |
| 4,847,504 A | 7/1989 | Aitken | |
| 4,851,255 A | 7/1989 | Lagendijk et al. | |
| 4,942,246 A | 7/1990 | Tanaka et al. | |
| 5,061,322 A | 10/1991 | Asano | |
| 5,899,733 A | 5/1999 | Gisdakis et al. | |
| 5,940,724 A | 8/1999 | Warren | |
| 5,943,594 A | 8/1999 | Bailey et al. | |
| 5,962,858 A | 10/1999 | Gwinn | |
| 5,977,552 A | 11/1999 | Foad | |
| 5,993,766 A | 11/1999 | Tom et al. | |
| 6,086,837 A | 7/2000 | Cowan et al. | |
| 6,096,467 A | 8/2000 | Shimizu et al. | |
| 6,135,128 A | 10/2000 | Graf et al. | |
| 6,146,601 A | 11/2000 | Abesadze et al. | |
| 6,215,125 B1 | 4/2001 | Chen et al. | |
| 6,376,664 B1 | 4/2002 | Chan et al. | |
| 6,420,304 B1 | 7/2002 | Tsai et al. | |
| 6,486,227 B2 | 11/2002 | Nohr et al. | |
| 6,559,462 B1 | 5/2003 | Carpenter et al. | |
| 6,600,092 B2 | 7/2003 | Lee | |
| 6,730,568 B2 | 5/2004 | Sohn | |
| 6,756,600 B2 | 6/2004 | Ng et al. | |
| 6,780,896 B2 | 8/2004 | MacDonald et al. | |
| 6,852,610 B2 | 2/2005 | Noda | |
| 6,872,639 B2 | 3/2005 | DeBoer et al. | |
| 6,893,907 B2 | 5/2005 | Maydan et al. | |
| 6,905,947 B2 | 6/2005 | Goldberg | |
| 7,094,670 B2 | 8/2006 | Collins et al. | |
| 7,138,768 B2 | 11/2006 | Maciejowski et al. | |
| 7,144,809 B2 | 12/2006 | Elers et al. | |
| 7,397,048 B2 | 7/2008 | Singh et al. | |
| 7,473,606 B2 | 1/2009 | Hsiao et al. | |
| 7,491,947 B2 | 2/2009 | Cobb et al. | |
| 7,563,308 B2 | 7/2009 | Tempel et al. | |
| 7,586,109 B2 | 9/2009 | Perel et al. | |
| 7,641,879 B2 | 1/2010 | Spielvogel et al. | |
| 7,655,931 B2 | 2/2010 | Gupta | |
| 7,666,770 B2 | 2/2010 | Sasaki et al. | |
| 7,759,657 B2 | 7/2010 | Tieger et al. | |
| 7,825,016 B2 | 11/2010 | Giles | |
| 7,833,886 B2 | 11/2010 | Giles et al. | |
| 7,919,402 B2 | 4/2011 | Jacobson et al. | |
| 7,947,582 B2 | 5/2011 | Hautala et al. | |
| 7,966,879 B2 | 6/2011 | Dietz et al. | |
| 8,013,312 B2 | 9/2011 | Adams | |
| 8,062,965 B2 | 11/2011 | Kaim et al. | |
| 8,187,971 B2 | 5/2012 | Russell et al. | |
| 8,237,134 B2 * | 8/2012 | Kaim et al. | 250/492.21 |
| 8,237,136 B2 | 8/2012 | Hautala et al. | |
| 8,252,651 B2 | 8/2012 | Kawasaki | |
| 8,399,865 B2 * | 3/2013 | Kaim et al. | 250/492.21 |
| 8,555,705 B2 | 10/2013 | Dietz et al. | |
| 8,779,383 B2 * | 7/2014 | Mayer et al. | 250/428 |
| 8,785,889 B2 * | 7/2014 | Kaim et al. | 250/492.21 |
| 2002/0014407 A1 | 2/2002 | Allen et al. | |
| 2003/0023118 A1 | 1/2003 | Kanayama et al. | |
| 2003/0203608 A1 | 10/2003 | Deboer et al. | |
| 2003/0216014 A1 | 11/2003 | Goldberg | |
| 2004/0002202 A1 | 1/2004 | Horsky et al. | |
| 2004/0110351 A1 | 6/2004 | Narasimha | |
| 2004/0166612 A1 | 8/2004 | Maydan et al. | |
| 2004/0235280 A1 | 11/2004 | Keys et al. | |
| 2004/0241460 A1 | 12/2004 | Bedell et al. | |
| 2005/0163693 A1 | 7/2005 | Spielvogel et al. | |
| 2005/0191816 A1 | 9/2005 | Vanderpool et al. | |
| 2005/0202657 A1 | 9/2005 | Borland et al. | |
| 2005/0277246 A1 | 12/2005 | Kirkpatrick et al. | |
| 2005/0287786 A1 | 12/2005 | Gammel et al. | |
| 2006/0097193 A1 | 5/2006 | Horsky et al. | |
| 2006/0102464 A1 | 5/2006 | Tillotson | |
| 2006/0104851 A1 | 5/2006 | Tillotson | |
| 2006/0264051 A1 | 11/2006 | Thibaut | |
| 2007/0059848 A1 | 3/2007 | Sasaki et al. | |
| 2007/0148888 A1 | 6/2007 | Krull et al. | |
| 2007/0178679 A1 | 8/2007 | Hatem et al. | |
| 2008/0149929 A1 | 6/2008 | Giles | |
| 2008/0179545 A1 | 7/2008 | Perel et al. | |
| 2008/0237496 A1 | 10/2008 | Gupta | |
| 2008/0242066 A1 | 10/2008 | Jacobson et al. | |
| 2008/0248636 A1 | 10/2008 | Olander et al. | |
| 2008/0305598 A1 | 12/2008 | Horsky et al. | |
| 2009/0200643 A1 | 8/2009 | Miki et al. | |
| 2009/0252887 A1 | 10/2009 | Barker et al. | |
| 2009/0294698 A1 | 12/2009 | Ray | |
| 2010/0024841 A1 | 2/2010 | Koo et al. | |
| 2010/0112795 A1 | 5/2010 | Kaim et al. | |
| 2010/0176306 A1 | 7/2010 | Lin et al. | |
| 2010/0224264 A1 | 9/2010 | Homan et al. | |
| 2011/0065268 A1 | 3/2011 | Olander et al. | |
| 2011/0079241 A1 | 4/2011 | Sinha et al. | |
| 2011/0097882 A1 | 4/2011 | Kaim et al. | |
| 2011/0143527 A1 | 6/2011 | Platow et al. | |
| 2011/0165053 A1 | 7/2011 | Cook et al. | |
| 2012/0108044 A1 | 5/2012 | Kaim et al. | |
| 2012/0119113 A1 | 5/2012 | Colvin et al. | |
| 2012/0252195 A1 | 10/2012 | Jones et al. | |
| 2013/0206788 A1 | 8/2013 | Kaim et al. | |

FOREIGN PATENT DOCUMENTS

| | | |
|---|---|---|
| JP | 58-8071 A | 1/1983 |
| JP | 62095820 A | 5/1987 |
| JP | 63-15228 A | 1/1988 |
| JP | 64-83147 A | 3/1989 |
| JP | 1-225117 A | 9/1989 |
| JP | 3165443 A | 7/1991 |
| JP | 5-254808 A | 10/1993 |
| JP | 6-80681 A | 3/1994 |
| JP | 7065761 A | 3/1995 |
| JP | 7-90201 A | 4/1995 |
| JP | 8288233 A | 11/1996 |
| JP | 10-251592 A | 9/1998 |
| JP | 2001-332509 A | 11/2001 |
| JP | 2011-502923 A | 1/2011 |
| KR | 10-2006-0077942 A | 7/2006 |
| TW | 200616104 A | 5/2006 |
| WO | 9811764 A1 | 3/1998 |
| WO | 03057667 A2 | 7/2003 |
| WO | 03100806 A1 | 12/2003 |
| WO | 2004003973 A2 | 1/2004 |
| WO | 2004053945 A2 | 6/2004 |
| WO | 2005020306 A1 | 3/2005 |
| WO | 2005027208 A1 | 3/2005 |
| WO | 2005059942 A2 | 6/2005 |

(56) References Cited

FOREIGN PATENT DOCUMENTS

| WO | 2006095086 A2 | 9/2006 |
|---|---|---|
| WO | 2007134183 A2 | 11/2007 |

OTHER PUBLICATIONS

Becher, H., et al., "Vibrational Spectra of Normal, Boron-10-Enriched, And Deuteriomethylboron Difuoride", "Spectrochimica Acta Part A: Molecular Spectroscopy", 1978, pp. 141-146 (English Abstract), vol. 34, No. 2.

Byl, O., et al., "Properties of Diboron Tetrafluoride (B2F4), A New Gas for Boron Ion Implantation", "AIP Conf. Proc., 18th International Conference on Ion Implantation Technology", Jun. 6-11, 2010, pp. 408-410, vol. CP1321, Published in: Kyoto, Japan.

Freer, B., et al., "Germanium Operation on the GSDIII/LED and Ultra High Current Ion Implanters", "Proceedings of the 14th International Conference on Ion Implantation Technology", Sep. 27, 2002, pp. 420-423.

Greenwell, D., et al., "Ion Implant Related Trends in Devices and Process Engineering", "Proceedings of the 11th International Conference on Ion Implantation Technology, Austin, TX", Jun. 16-21, 1996, pp. 1-4.

Hess, D., et al, "Performance Comparison of Enriched versus Non-Enriched SDS GeF4", "Conference on Ion Implantation Technology", Sep. 17-22, 2000, pp. 726-729.

Rendon, M., et al., "Reducing Arsenic to Germanium Cross-Contamination with Isotopically Enriched SDS 72GeF4", "Conference on Ion Implantation Technology", Sep. 17-22, 2000, pp. 707-710.

Sinn, C., et al., "Application of Isotopically Enriched Germanium Tetrafluoride for Contaminant Reduction and Ion Source Lifetime Benefits", "Proceedings of the 14th International Conference on Ion Implantation Technology", Sep. 27, 2002, pp. 411-412.

Co-pending Unpublished U.S. Appl. No. 14/331,092, filed Jul. 14, 2014.

Weast, R. (Ed.), "Physical Constants of Inorganic Compounds—Boric Acid", "Handbook of Chemistry and Physics, 56th Edition", Sep. 1975, pp. B-78, Publisher: CRC Press, Inc.

Thomson Reuters, "XP-002713450—Ion implantation capable of preventing characteristic deterioration due to contamination in ion implantation process", "Database World Patent Index Week 200727", Jul. 5, 2006, p. 1.

Yu, J., et al., "Isotopically Enriched 10BN Nanotubes", "Advanced Materials", Jul. 2006, pp. 2157-2160, vol. 18.

NOTE: For the non-patent literature citations that no month of publication is indicated, the year of publication is more than 1 year prior to the effective filing date of the prestent application.

NOTE: As to any co-pending U.S. applications cited herein, Applicant will provide at the examiner's request copies of any documents desired by the examiner from the USPTO file history of any such co-pending applications.

\* cited by examiner

METHOD AND APPARATUS FOR ENHANCED LIFETIME AND PERFORMANCE OF ION SOURCE IN AN ION IMPLANTATION SYSTEM

CROSS-REFERENCE TO RELATED APPLICATIONS

The present application is a continuation under 35 USC 120 of U.S. patent application Ser. No. 13/840,961, filed Mar. 15, 2013, in the names of Robert Kaim, et al. for "METHOD AND APPARATUS FOR ENHANCED LIFETIME AND PERFORMANCE OF ION SOURCE IN AN ION IMPLANTATION SYSTEM, issuing Jul. 22, 2014 as U.S. Pat. No. 8,785,889, which is a continuation under 35 USC 120 of U.S. patent application Ser. No. 13/567,571, filed Aug. 6, 2012, in the names of Robert Kaim, et al. for "METHOD AND APPARATUS FOR ENHANCED LIFETIME AND PERFORMANCE OF ION SOURCE IN AN ION IMPLANTATION SYSTEM," issued Mar. 19, 2013 as U.S. Pat. No. 8,399,865, which is a continuation under 35 USC 120 of U.S. patent application Ser. No. 13/401,527, filed Feb. 21, 2012, in the names of Robert Kaim, et al. for "METHOD AND APPARATUS FOR ENHANCED LIFETIME AND PERFORMANCE OF ION SOURCE IN AN ION IMPLANTATION SYSTEM," issued Aug. 7, 2012 as U.S. Pat. No. 8,237,134, which is a continuation under 35 USC 120 of International Application PCT/US2011/026388, with an international filing date of Feb. 26, 2011 in the names of Robert Kaim, et al. for "METHOD AND APPARATUS FOR ENHANCED LIFETIME AND PERFORMANCE OF ION SOURCE IN AN ION IMPLANTATION SYSTEM," which International Application claims the benefit of priority under 35 USC 119 of U.S. Provisional Patent Application No. 61/308,428 filed Feb. 26, 2010 in the names of Robert Kaim, et al. for "METHOD AND APPARATUS FOR ENHANCED LIFETIME AND PERFORMANCE OF ION SOURCE IN AN ION IMPLANTATION SYSTEM" and the benefit of priority under 35 USC 119 of U.S. Provisional Patent Application No. 61/390,715 filed Oct. 7, 2010 in the names of Robert Kaim, et al. for "METHOD AND APPARATUS FOR ENHANCED LIFETIME AND PERFORMANCE OF ION SOURCE IN AN ION IMPLANTATION SYSTEM." The disclosures of said U.S. patent applications, said International Application and said U.S. Provisional Patent Application Nos. 61/308,428 and 61/390,715 are hereby incorporated herein by reference, in their respective entireties, for all purposes.

FIELD

The present disclosure relates to ion implantation using dopants and dopant gas mixtures for enhanced lifetime and performance of an ion source in an ion implantation system.

BACKGROUND

Ion implantation as practiced in semiconductor manufacturing involves deposition of a chemical species into a substrate, such as a microelectronic device wafer, by impingement of energetic ions of such species on the substrate. In order to generate the ionic implantation species, the dopant gas, which may for example comprise a halide or hydride of the dopant species, is subjected to ionization. This ionization is carried out using an ion source to generate an ion beam.

Once generated at the ion source, the ion beam is processed by extraction, magnetic filtering, acceleration/deceleration, analyzer magnet processing, collimation, scanning and magnetic correction to produce the final ion beam that is impinged on the substrate.

Various types of ion sources have been developed, including inductively heated cathode ion sources, Freeman, Bernas, and various others, but regardless of the specific type of ion source employed, the ion source must be capable of continuous operation for extended periods of time, without the occurrence of "glitching" or other impairment that would necessitate shut-down, maintenance or repair of the ion source. Accordingly, ion source lifetime is a critical characteristic of the ion implantation system, as regards the efficient and cost-effective operation of the system.

Ion source failures are attributable to various causes, including accumulation of deposits on cathode surfaces that negatively affect thermionic emission of ions, resulting in lowered arc currents, reduced performance and shortened lifetime of the ion source, as well as deleterious etching reactions from such dopant gases as germanium tetrafluoride as a result of the generation of free fluorine in the arc chamber, as well as stripping or sputtering of cathode material resulting in loss of physical integrity of the cathode and consequent reduction of performance and lifetime of the ion source.

In consequence of the need to avoid ion source failures, and to maintain the operating efficiency and lifetime of the ion source at high levels, the art is continually engaged in efforts to enhance lifetime and performance of ion sources in ion implantation systems.

SUMMARY

The present disclosure relates to ion implantation systems and processes, and to method and apparatus for achieving enhanced lifetime and performance of ion sources in such systems and processes.

In one aspect, the disclosure relates to an ion implantation process, comprising flowing a dopant composition to an ion source for generation of ionic dopant species for implantation, wherein the dopant composition is selected from the group consisting of:

(i) germanium compounds isotopically enriched to above natural abundance level of at least one germanium isotope of mass 70, 72, 73, 74 or 76, wherein the isotopically enriched level of said at least one germanium isotope is greater than 21.2% for mass 70 germanium isotope, greater than 27.3% for mass 72 germanium isotope, greater than 7.9% for mass 73 germanium isotope, greater than 37.1% for mass 74 germanium isotope, and greater than 7.4% for mass 76 germanium isotope, with the proviso that when the dopant composition consists of germanium tetrafluoride isotopically enriched in mass 72 germanium isotope, said isotopically enriched level is greater than 51.6% for the mass 72 germanium isotope; and (ii) dopant gas formulations comprising a dopant gas and a supplemental gas, wherein the supplemental gas includes at least one of a diluent gas and a co-species gas, and wherein at least one of the dopant gas and, when present, a co-species gas, is isotopically enriched.

In another aspect, the disclosure relates to a method of operating an ion source in an ion implantation process of the type described above, comprising:
sequentially flowing to the ion source different dopant materials comprised in said dopant composition;
monitoring cathode bias power during operation of the ion source during the sequential flow of said different dopant materials to the ion source; and in response to the monitored cathode bias power, modulating at least one of said sequentially supplied dopant compositions, to extend operating lifetime of the ion source, cathode and/or one or more other components of the ion source.

A further aspect of the disclosure relates to a method of improving performance and lifetime of an ion source arranged to generate ionic doping species for ion implantation from a dopant feedstock, comprising generating said ionic doping species from a dopant composition as described above in connection with the ion implantation process of the disclosure.

The disclosure relates in another aspect to an ion implantation system, comprising an ion source and a dopant composition source arranged for supplying dopant composition to said ion source, wherein said dopant composition source comprises a dopant composition as described above in connection with the ion implantation process of the disclosure.

Another aspect of the disclosure relates to a dopant feedstock apparatus, comprising a vessel having interior volume, and a dopant feedstock in the interior volume, wherein the dopant feedstock comprises a dopant composition as described above in connection with the ion implantation process of the disclosure.

A further aspect of the disclosure relates to a method of increasing at least one of source life and turbo pump life in an ion implantation system in which germanium ions are implanted in a substrate, said method comprising ionizing a germanium-containing dopant gas in an ionization chamber of said ion implantation system, wherein said germanium-containing dopant gas comprises a mixture of germane and one or more of hydrogen, argon, nitrogen, and helium, wherein said dopant gas optionally is isotopically enriched in at least one isotopic Ge species Yet another aspect of the disclosure relates to a method of increasing ion source life in an ion implantation system wherein germanium tetrafluoride is introduced and ionized in said ion source, said method comprising introducing ammonia with said germanium tetrafluoride to the ion source, and wherein said germanium tetrafluoride optionally is isotopically enriched in at least one Ge isotopic species.

A further aspect of the disclosure relates to a dopant gas composition comprising a dopant gas and a supplemental gas, wherein the supplemental gas includes at least one of a diluent gas and a co-species gas, and wherein at least one of the dopant gas and, when present, a co-species gas, is isotopically enriched.

In another aspect, the disclosure relates to a method of operating an ion source, comprising:
sequentially flowing different dopant materials to the ion source;
monitoring cathode bias power during operation of the ion source during the sequential flow of said different dopant materials to the ion source; and
in response to the monitored cathode bias power, modulating at least one of said sequentially supplied dopant compositions, to extend operating lifetime of the ion source, cathode and/or one or more other components of the ion source.

A still further aspect of the disclosure relates to a method of operating an ion source, comprising:
flowing dopant material to the ion source;
monitoring cathode bias power during operation of the ion source during the flow of said dopant material to the ion source; and
in response to the monitored cathode bias power, flowing a cleaning or deposition agent to the ion source, to extend operating lifetime of the ion source, cathode and/or one or more other components of the ion source, in relation to a corresponding ion source lacking said flowing a cleaning or deposition agent thereto.

Other aspects, features and embodiments of the disclosure will be more fully apparent from the ensuing description and appended claims.

DETAILED DESCRIPTION

Figure 1:
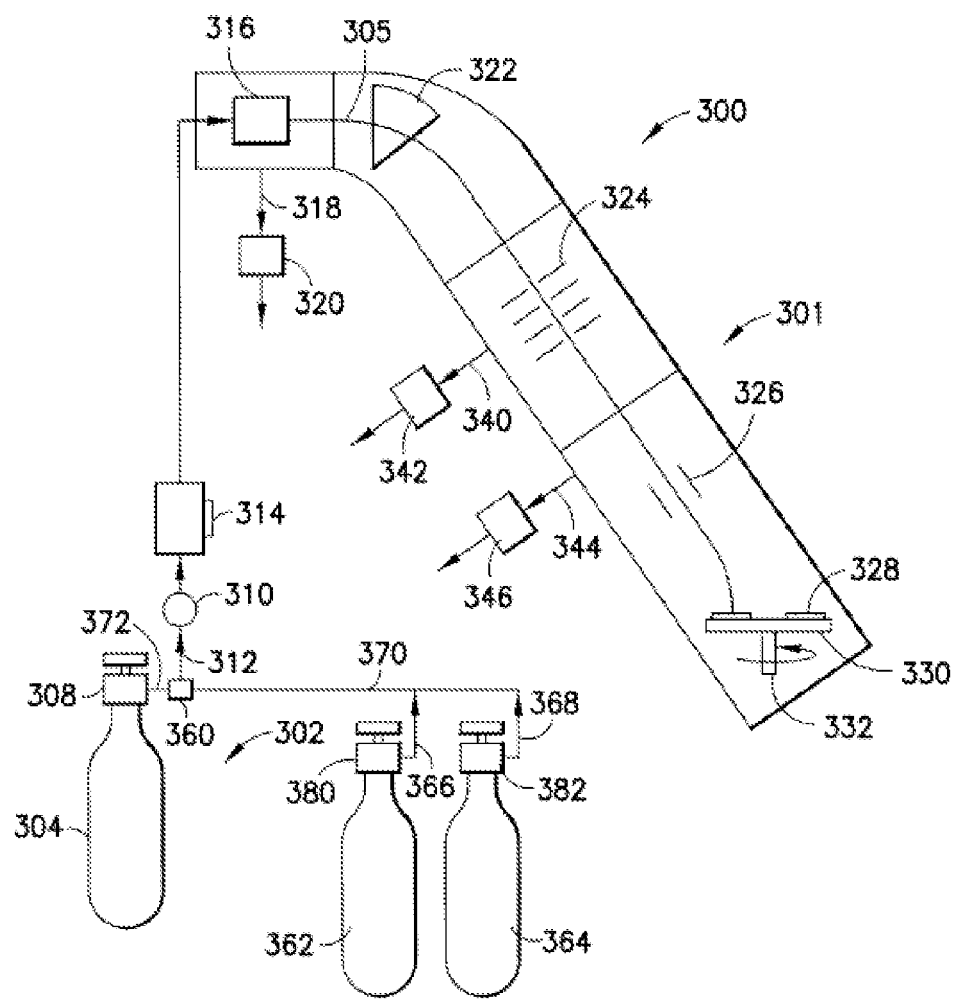
FIG. 1 is a schematic representation of an ion implant process system according to one aspect of the disclosure.

The present disclosure relates to the use of isotopically enriched dopant and/or supplemental materials for improving the lifetime (service life) and performance of an ion source of an ion implantation system.

As used herein, the singular forms "a", "and", and "the" include plural referents unless the context clearly dictates otherwise.

The disclosure, as variously set out herein in respect of features, aspects and embodiments thereof, may in particular implementations be constituted as comprising, consisting, or consisting essentially of, some or all of such features, aspects and embodiments, as well as elements and components thereof being aggregated to constitute various further implementations of the invention. The disclosure is set out herein in various embodiments, and with reference to various features and aspects of the invention. The disclosure contemplates such features, aspects and embodiments in various permutations and combinations, as being within the scope of the disclosure. The disclosure may therefore be specified as comprising, consisting or consisting essentially of, any of such combinations and permutations of these specific features, aspects and embodiments, or a selected one or ones thereof.

The compounds, compositions, features, steps and methods of the disclosure may be further specified in particular embodiments by provisos or limitations excluding specific substituents, isotopes, moieties, structures, ingredients, characteristics, steps or conditions, as applicable, in relation to various specifications and exemplifications thereof set forth herein.

The ion implantation systems and processes of the present disclosure as a result of using such isotopically enriched dopant and/or supplemental materials achieve enhanced ion source lifetime and performance, in relation to corresponding ion implantation systems and processes not using such isotopically enriched dopant and/or supplemental materials.

As used herein, the term "dopant gas" refers to a gas-phase material including a dopant species, i.e., the species to be implanted in the ion implantation substrate, as coordinated or associated to a non-dopant component, such as a hydride, halide, organo or other moiety. Examples of dopant gases include germanium tetrafluoride, germane, boron trifluoride, diborane, silicon tetrafluoride, silane, phosphine and arsine.

The term "supplemental gas" as used herein refers to a diluent gas or a co-species gas.

A diluent gas is a gas that does not contain the dopant species and is effective in mixture with the dopant gas to improve the lifetime and performance of an ion source processing such diluent gas-containing mixture with the dopant gas, as compared to the lifetime and performance of a corresponding ion source processing the dopant gas without the presence of the diluent gas. Examples of illustrative diluent gases include hydrogen, argon, fluorine, and xenon.

A co-species gas is a gas that contains the same dopant species as the dopant gas, wherein such same dopant species is coordinated or associated to a non-dopant component that is different from the non-dopant component of the dopant gas.

For example, the dopant gas may be germanium tetrafluoride, and the co-species gas may be germane, $GeH_4$.

The disclosure in one aspect relates to an ion implantation process, comprising flowing a dopant composition to an ion source for generation of ionic dopant species for implantation, wherein the dopant composition is selected from the group consisting of:

(i) germanium compounds isotopically enriched to above natural abundance level of at least one germanium isotope of mass 70, 72, 73, 74 or 76, wherein the isotopically enriched level of said at least one germanium isotope is greater than 21.2% for mass 70 germanium isotope, greater than 27.3% for mass 72 germanium isotope, greater than 7.9% for mass 73 germanium isotope, greater than 37.1% for mass 74 germanium isotope, and greater than 7.4% for mass 76 germanium isotope, with the proviso that when the dopant composition consists of germanium tetrafluoride isotopically enriched in mass 72 germanium isotope, said isotopically enriched level is greater than 51.6% for the mass 72 germanium isotope; and (ii) dopant gas formulations comprising a dopant gas and a supplemental gas, wherein the supplemental gas includes at least one of a diluent gas and a co-species gas, and wherein at least one of the dopant gas and, when present, a co-species gas, is isotopically enriched.

In various embodiments of such process, the dopant composition can be selected from the group consisting of germanium compounds isotopically enriched to above natural abundance level of at least one germanium isotope of mass 70, 72, 73, 74 or 76. The dopant composition can therefore comprise: a germanium compound isotopically enriched to greater than 21.2% in mass 70 germanium isotope; a germanium compound isotopically enriched to greater than 27.3% in mass 72 germanium isotope; a germanium compound isotopically enriched to greater than 51.6% in mass 72 germanium isotope; a germanium compound isotopically enriched to greater than 7.9% in mass 73 germanium isotope; a germanium compound isotopically enriched to greater than 37.1% in mass 74 germanium isotope; or a germanium compound isotopically enriched to greater than 7.4% in mass 76 germanium isotope.

The process in other embodiments may be practiced with the germanium compound comprising at least one of germanium tetrafluoride and germane. For example, the germanium compound may comprise germanium tetrafluoride, in which germanium in the germanium tetrafluoride can have: an isotopically enriched level of mass 70 germanium isotope that is greater than 21.2%; an isotopically enriched level of mass 72 germanium isotope that is greater than 27.3%; an isotopically enriched level of mass 72 germanium isotope that is greater than 51.6%; an isotopically enriched level of mass 73 germanium isotope that is greater than 7.9%; an isotopically enriched level of mass 74 germanium isotope that is greater than 37.1%; or an isotopically enriched level of mass 76 germanium isotope that is greater than 7.4%.

Still other embodiments of the disclosure can be carried out in which the dopant composition comprises germane, and the germanium in the germane has: an isotopically enriched level of mass 70 germanium isotope that is greater than 21.2%; an isotopically enriched level of mass 72 germanium isotope that is greater than 51.6%; an isotopically enriched level of mass 73 germanium isotope that is greater than 7.9%; an isotopically enriched level of mass 74 germanium isotope that is greater than 37.1%; or an isotopically enriched level of mass 76 germanium isotope that is greater than 7.4%.

The ion implantation process broadly described above can be carried out in other embodiments in which the dopant composition is selected from the group consisting of dopant gas formulations comprising a dopant gas and a supplemental gas, wherein the supplemental gas includes at least one of a diluent gas and a co-species gas, and wherein at least one of the dopant gas and, when present, a co-species gas, is isotopically enriched. In various embodiments, such at least one of the dopant gas and, when present, the co-species gas, that is isotopically enriched, can be selected from the group consisting of germanium compounds isotopically enriched above natural abundance level of at least one germanium isotope of mass 70, 72, 73, 74 or 76. Illustrative examples of such isotopically enriched germanium compounds include: germanium compounds isotopically enriched to greater than 21.2% in mass 70 germanium isotope; germanium compounds isotopically enriched to greater than 27.3% in mass 72 germanium isotope; germanium compounds isotopically enriched to greater than 51.6% in mass 72 germanium isotope; germanium compounds isotopically enriched to greater than 7.9% in mass 73 germanium isotope; germanium compounds isotopically enriched to greater than 37.1% in mass 74 germanium isotope; and germanium compounds isotopically enriched to greater than 7.4% in mass 76 germanium isotope.

In various implementations of the ion implantation process, the dopant composition can comprise at least one of germanium tetrafluoride and germane. For example, the dopant composition can comprise germanium tetrafluoride, in which the germanium has: an isotopically enriched level of mass 70 germanium isotope that is greater than 21.2%; an isotopically enriched level of mass 72 germanium isotope that is greater than 27.3%; an isotopically enriched level of mass 72 germanium isotope that is greater than 51.6%; an isotopically enriched level of mass 73 germanium isotope that is greater than 7.9%; an isotopically enriched level of mass 74 germanium isotope that is greater than 37.1%; or an isotopically enriched level of mass 76 germanium isotope that is greater than 7.4%.

Alternatively, the dopant composition can comprise germane, in which the germanium has: an isotopically enriched level of mass 70 germanium isotope that is greater than 21.2%; an isotopically enriched level of mass 72 germanium isotope that is greater than 27.3%; an isotopically enriched level of mass 73 germanium isotope that is greater than 7.9%; an isotopically enriched level of mass 74 germanium isotope that is greater than 37.1%; or an isotopically enriched level of mass 76 germanium isotope that is greater than 7.4%.

In other embodiments of the process, the supplemental gas may include a diluent gas, e.g., at least one gas species selected from the group consisting of argon, hydrogen, fluorine and xenon. Still other embodiments may include a supplemental gas comprising a co-species gas.

Yet other embodiments of the process employ a dopant composition comprising at least one of germanium tetrafluoride, germane, boron trifluoride, diborane, silicon tetrafluoride and silane.

Still other embodiments of the process employ a dopant gas selected from the group consisting of germanium tetrafluoride, germane, boron trifluoride, diborane, silicon tetrafluoride and silane, and a diluent gas comprising at least one diluent gas species selected from the group consisting of argon, hydrogen, fluorine, and xenon.

The dopant composition in other embodiments of the process includes a dopant gas formulation selected from the group consisting of:

(i) isotopically enriched germanium tetrafluoride with xenon and hydrogen;
(ii) isotopically enriched germanium tetrafluoride with germane;
(iii) isotopically enriched germanium tetrafluoride and isotopically enriched germane;
(iv) isotopically enriched boron trifluoride with xenon and hydrogen;
(v) isotopically enriched boron trifluoride with diborane; and
(vi) isotopically enriched boron trifluoride and isotopically enriched diborane.

In various embodiments of the process, the dopant gas and co-species gas are flowed in mixture with one another to the ion source for generation of ionic dopant species for implantation. Other embodiments of the process are carried out in which the dopant gas and co-species gas are sequentially flowed to the ion source for generation of ionic dopant species for implantation.

In the ion implantation process of the disclosure, the ion source in one embodiment can be operated according to the following methodology: flowing sequentially to the ion source different dopant materials comprised in said dopant composition different dopant materials comprised in the dopant composition; monitoring cathode bias power during operation of the ion source during the sequential flow of the different dopant materials to the ion source; and in response to the monitored cathode bias power, modulating at least one of the sequentially supplied dopant compositions, to extend operating lifetime of the ion source, cathode and/or one or more other components of the ion source.

The disclosure in another aspect relates to a method of improving performance and lifetime of an ion source arranged to generate ionic doping species for ion implantation from a dopant feedstock, comprising generating such ionic doping species from any of the dopant compositions of the present disclosure, as variously described herein. In one embodiment of such method, a dopant gas and co-species gas are flowed in mixture with one another to the ion source for generation of ionic dopant species for implantation. In another embodiment of such method, a dopant gas and co-species gas are sequentially flowed to the ion source for generation of ionic dopant species for implantation.

A further aspect of the disclosure relates to an ion implantation system, comprising an ion source and a dopant composition source arranged for supplying dopant composition to said ion source, wherein the dopant composition source comprises any of the dopant compositions as variously described herein. In such ion implantation system, the dopant composition may comprise dopant gas and co-species gas, and the dopant composition source may be arranged to flow the dopant gas and co-species gas in mixture with one another to said ion source for supplying dopant composition thereto. Alternatively, the dopant composition source may be arranged for sequentially flowing dopant gas and co-species gas to the ion source for supply of dopant composition thereto.

A still further aspect of the disclosure relates to a dopant feedstock apparatus, comprising a vessel having interior volume, and a dopant feedstock in the interior volume, wherein the dopant feedstock comprises any of the dopant compositions as variously described herein.

The disclosure relates in another aspect to a method of increasing at least one of source life and turbo pump life in an ion implantation system in which germanium ions are implanted in a substrate. The method comprises ionizing a germanium-containing dopant gas in an ionization chamber of the ion implantation system, wherein the germanium-containing dopant gas comprises a mixture of germane and one or more of hydrogen, argon, nitrogen, and helium, wherein the dopant gas optionally is isotopically enriched in at least one isotopic Ge species.

For example, germane may be present in such mixture at a concentration in a range of from 5 to 35 percent volume, based on the total volume of the mixture.

The disclosure in a further aspect relates to a method of increasing ion source life in an ion implantation system wherein germanium tetrafluoride is introduced and ionized in the ion source. The method comprises introducing ammonia with the germanium tetrafluoride to the ion source, and wherein the germanium tetrafluoride optionally is isotopically enriched in at least one Ge isotopic species. In such method, the ammonia and germanium tetrafluoride may be provided in a mixture in a supply vessel from which the mixture is dispensed for introduction thereof to the ion source. Alternatively, in such method, the ammonia and germanium tetrafluoride may be provided in separate supply vessels from which they are dispensed for introduction thereof to the ion source. As a still further embodiment, the ammonia and germanium tetrafluoride may be mixed with one another in the ion source after introduction thereof to the ion source.

Another variant of such method involves introducing xenon to the ion source. The xenon may be introduced in mixture with ammonia and/or germanium tetrafluoride.

In another embodiment of such method as broadly described above, the germanium tetrafluoride may be isotopically enriched in at least one Ge isotopic species, e.g., at least one Ge isotopic species comprises germanium isotope selected from the group consisting of $^{70}$Ge, $^{72}$Ge and $^{74}$Ge.

A further aspect of the disclosure relates to a dopant gas composition comprising a dopant gas and a supplemental gas, wherein the supplemental gas includes at least one of a diluent gas and a co-species gas, and wherein at least one of the dopant gas and, when present, a co-species gas, is isotopically enriched. The composition, wherein at least one of the dopant gas and, when present, the co-species gas, is isotopically enriched, may be selected from the group consisting of germanium compounds isotopically enriched above natural abundance level of at least one germanium isotope of mass 70, 72, 73, 74 or 76.

Such compounds may include: a germanium compound isotopically enriched to greater than 21.2% in mass 70 germanium isotope; a germanium compound isotopically enriched to greater than 27.3% in mass 72 germanium isotope; a germanium compound isotopically enriched to greater than 51.6% in mass 72 germanium isotope; a germanium compound isotopically enriched to greater than 7.9% in mass 73 germanium isotope; a germanium compound isotopically enriched to greater than 37.1% in mass 74 germanium isotope; or a germanium compound isotopically enriched to greater than 7.4% in mass 76 germanium isotope.

The dopant composition in another embodiment comprises at least one of germanium tetrafluoride and germane.

When the composition comprises germanium tetrafluoride, the germanium in the germanium tetrafluoride may have: an isotopically enriched level of mass 70 germanium isotope that is greater than 21.2%; an isotopically enriched level of mass 72 germanium isotope that is greater than 27.3%; an isotopically enriched level of mass 72 germanium isotope that is greater than 51.6%; an isotopically enriched level of mass 73 germanium isotope that is greater than 7.9%;

an isotopically enriched level of mass 74 germanium isotope that is greater than 37.1%; or an isotopically enriched level of mass 76 germanium isotope that is greater than 7.4%.

When the composition comprises germane, the germanium in the germane may have: an isotopically enriched level of mass 70 germanium isotope that is greater than 21.2%; an isotopically enriched level of mass 72 germanium isotope that is greater than 27.3%; an isotopically enriched level of mass 73 germanium isotope that is greater than 7.9%; an isotopically enriched level of mass 74 germanium isotope that is greater than 37.1%; or an isotopically enriched level of mass 76 germanium isotope that is greater than 7.4%.

The dopant composition in other embodiments may be constituted to include a supplemental gas that comprises a co-species gas, or alternatively a diluent gas, or alternatively, both a co-species gas and a diluent gas. The diluent gas can include, for example, at least one gas species selected from the group consisting of argon, hydrogen, fluorine and xenon.

The dopant composition in another embodiment can comprise at least one of germanium tetrafluoride, germane, boron trifluoride, diborane, silicon tetrafluoride and silane. A further dopant composition can include dopant gas selected from the group consisting of germanium tetrafluoride, germane, boron trifluoride, diborane, silicon tetrafluoride and silane, and diluent gas comprising at least one diluent gas species selected from the group consisting of argon, hydrogen, fluorine, and xenon.

The dopant composition in specific embodiments may comprise any of:
(i) isotopically enriched germanium tetrafluoride with xenon and hydrogen;
(ii) isotopically enriched germanium tetrafluoride with germane;
(iii) isotopically enriched germanium tetrafluoride and isotopically enriched germane;
(iv) isotopically enriched boron trifluoride with xenon and hydrogen;
(v) isotopically enriched boron trifluoride with diborane; and
(vi) isotopically enriched boron trifluoride and isotopically enriched diborane.

Dopant compositions of the disclosure are effective to improve the lifetime and performance of an implantation process, as compared to the lifetime and performance of a corresponding process that does not utilize isotopically enriched dopant gas and isotopically enriched supplemental gas.

As used herein, the term "isotopically enriched" or "enriched" in reference to a dopant gas and/or co-species gas means that the dopant species in such gas(es) are varied from a naturally occurring isotopic distribution of the dopant species. By way of example, a natural abundance isotopic distribution of concentrations of germanium in a germanium tetrafluoride dopant gas, and the isotopic distribution of germanium concentrations in an illustrative isotopically enriched germanium tetrafluoride dopant gas, are shown in the following Table I.

TABLE I

Isotopic Distributions in Natural and Isotopically Enriched Germanium Tetrafluoride

| Isotope | Concentration (+/−1%) | |
|---|---|---|
| | Natural | Enriched |
| 70 | 21.2% | 15.8% |
| 72 | 27.3% | 51.6% |

TABLE I-continued

Isotopic Distributions in Natural and Isotopically Enriched Germanium Tetrafluoride

| Isotope | Concentration (+/−1%) | |
|---|---|---|
| | Natural | Enriched |
| 73 | 7.9% | 9.4% |
| 74 | 37.1% | 20.1% |
| 76 | 7.4% | 3.1% |

The information shown in Table I shows that germanium isotopes occur at mass 70, 72, 73, 74 and 76, with $^{74}$Ge being the most abundant.

The present disclosure contemplates ion implantation, wherein any one or more of such stable isotopes of germanium is enriched, i.e., increased in concentration above natural abundance level thereof, in the germanium dopant gas. Thus, the dopant gas in one embodiment may comprise germanium tetrafluoride, or germane, in which the germanium is isotopically enriched above natural abundance levels in at least one isotope. The disclosure in another embodiment relates to germanium dopant gases in which the dopant gas is germanium tetrafluoride, and such dopant gas is enriched above natural abundance level in germanium isotope of mass 70, 72, 73 or 74, with the proviso in various embodiments that when the germanium isotope enriched above natural abundance level is $^{72}$Ge, e.g., in germanium tetrafluoride, then the enriched concentration is greater than 51.6%, e.g., with a concentration of $^{72}$Ge that is greater than 52%, 55%, 60%, 70%, 80%, 90%, 99% or 99.99%, in corresponding embodiments. In other embodiments, the enriched level of $^{72}$Ge in a germanium compound in the dopant composition may be greater than 27.3%.

By way of specific examples, the isotopically enriched dopant gas can comprise a dopant selected from the group consisting of:
(i) germane ($GeH_4$), isotopically enriched in $^{70}$Ge above 21.2%, e.g., with a concentration of $^{70}$Ge that is greater than 22%, 25%, 30%, 40%, 50%, 60%, 70%, 80%, 90%, 99% or 99.99%, in various corresponding embodiments;
(ii) germane ($GeH_4$), isotopically enriched in $^{72}$Ge above 27.3%, e.g., with a concentration of $^{72}$Ge that is greater than 28%, 30%, 40%, 50%, 60%, 70%, 80%, 90%, 99% or 99.99%, in various corresponding embodiments;
(iii) germane ($GeH_4$), isotopically enriched in $^{74}$Ge above 37.1%, e.g., with a concentration of $^{74}$Ge that is greater than 38%, 40%, 50%, 60%, 70%, 80%, 90%, 99% or 99.99%, in various corresponding embodiments;
(iv) germanium tetrafluoride ($GeF_4$), isotopically enriched in $^{70}$Ge above 21.2%, e.g., with a concentration of $^{70}$Ge that is greater than 22%, 25%, 30%, 40%, 50%, 60%, 70%, 80%, 90%, 99% or 99.99%, in various corresponding embodiments;
(v) germanium tetrafluoride ($GeF_4$), isotopically enriched in $^{72}$Ge above 27.3% in some embodiments, and above 51.6% in other embodiments, e.g., with a concentration of $^{72}$Ge that is greater than 52%, 55%, 60%, 70%, 80%, 90%, 99% or 99.99%, in various corresponding embodiments; and
(vi) germanium tetrafluoride ($GeF_4$), isotopically enriched in $^{74}$Ge above 37.1%, e.g., with a concentration of $^{74}$Ge that is greater than 38%, 40%, 50%, 60%, 70%, 80%, 90%, 99% or 99.99%, in various corresponding embodiments.

Considering usage of germanium dopants containing $^{74}$Ge, the use of $^{74}$Ge as an implanted germanium species, or the presence thereof in a dopant composition carries the risk of cross contamination when such $^{74}$Ge-containing dopant is used in an implanter that also processes arsenic having a mass of 75, since counter-doping from arsenic residues in Ge implantation can result. Such counter-doping in turn can render implanted microelectronic device structures deficient or even useless for their intended purpose. Thus, the usage of natural abundance germanium dopant gas challenges the implanter's ability to resolve unwanted species and produce high current beams of the desired isotope, in instances in which arsenic is also implanted in other usage of the same implanter, and can reduce the efficiency of cleaning operations involving the ion source and beamline.

In addition to such cross-contamination with $^{75}$As, the presence of $^{74}$Ge in ion implantation systems may produce cross-contamination with corrosion byproducts of $BF_3$ or $GeF_4$ with stainless steel tubing that delivers the dopant gas to the arc chamber, e.g., FeF. Such issues of cross-contamination are, however, absent in implanter systems in which arsenic is not utilized as a dopant, and in which the dopant gas delivery tube to arc chamber interface uses components of graphite, tungsten or other suitable materials that eliminate or minimize the generation of FeF. In such implanter systems, dopant gases containing $^{74}$Ge may be employed without the disadvantages of such cross-contamination.

In ion implantation systems in which dopant gases containing $^{74}$Ge can be utilized without adverse effect, the present disclosure, in one aspect thereof, contemplates the use of germanium-containing dopant gas enriched in $^{74}$Ge beyond natural abundance, taking advantage of the fact that natural abundance concentration of $^{74}$Ge is higher than other stable germanium isotopes ($^{70}$Ge, $^{72}$Ge and $^{73}$Ge), as shown in Table I above. Such higher concentration of $^{74}$Ge, relative to other stable isotopes in natural abundance isotopic compositions, enables enrichment levels above natural abundance to be more economically achieved for $^{74}$Ge than for other germanium isotopes having lower natural abundance concentration that are enriched to a corresponding enrichment level. Alternatively, from the standpoint of capital equipment and process costs, the higher natural abundance concentration of $^{74}$Ge can be advantageous to achieve higher enrichment content than is obtainable at the same cost for other stable germanium isotopes ($^{70}$Ge, $^{72}$Ge and $^{73}$Ge).

To address the germanium implantation issues of arsenic contamination, in ion implantation systems in which arsenic doping is conducted, the less abundant mass 72 germanium isotope can be advantageously employed. However, the naturally occurring abundance of mass 72 germanium isotope in, for example, germanium tetrafluoride is 27.3%, as compared to 37.1% for mass 74 germanium isotope (see Table I, above). The use of natural abundance germanium thus causes a reduction of available beam current, potential decrease in throughput, and an increase in implantation cost.

Accordingly, the use of isotopically enriched mass 72 germanium in germanium tetrafluoride or germane, in accordance with the present disclosure, achieves significant benefit in increasing available beam current, increasing throughput and decreasing implantation cost, in those systems susceptible to cross-contamination due to the presence of mass 74 germanium in the dopant composition. For example, the enrichment of mass 72 germanium isotope, e.g., to a level greater than 27.3% in germanium tetrafluoride or germane is beneficial in correspondingly increasing beam current which in turn is advantageous in yielding a corresponding increase in throughput in the ion implantation system.

Analogous benefits in increased beam current, throughput, and overall performance, can be achieved with other isotopically enriched dopant compositions, such as germanium tetrafluoride, or germane, isotopically enriched in $^{70}$Ge.

The present disclosure thus broadly contemplates isotopically enriched dopant gases, and/or isotopically enriched co-species gases, in which the concentration of a beneficial isotope is increased in relation to its natural occurrence in such dopant and/or co-species gases, to such extent as to improve the performance and lifetime of the ion source in the ion implantation system, in relation to a corresponding system in which the dopant and/or co-species gases are not isotopically adjusted from natural abundance concentration levels. The term "isotopically enriched" is therefore to be understood as indicating an increased concentration, relative to natural abundance levels, of the particular isotopic species considered.

In various specific embodiments, the beneficial/desired isotope may be increased, relative to natural abundance concentration, by the amount of 5, 10, 15, 20, 25, 30, 35, 40, 45, 50, 55, 60 or more percent, above the natural abundance concentration level of such isotope. In other specific embodiments, the beneficial/desired isotope may be enriched from the natural abundance concentration level to a higher concentration level, such as 10, 20, 30, 40, 50, 60, 70, 80, 90, 99, 99.99 or more percent, depending on the specific isotopic species involved.

As used herein, the term "by" in reference to a percentage increase of an isotope above the natural abundance concentration, such as in the phrase "increased, relative to natural abundance concentration, by the amount of . . . " means that the percentage increase is based on the natural abundance atomic percentage of the specified isotope in the specified element or compound. Thus, for example, the phrase "increased, relative to natural abundance concentration, by the amount of 20 percent, e.g., for $^{70}$Ge in $GeF_4$, means that the 21.2% atomic percent natural abundance for $^{70}$Ge in $GeF_4$ is increased by 21.2%×1.20=25.4% of $^{70}$Ge in the isotopically enriched $GeF_4$ compound.

By contrast, the term "to" in reference to a percentage of an isotope above the natural abundance concentration, such as in the phrase "enriched from the natural abundance concentration level to a higher concentration level of . . . " means that the atomic percent concentration in the isotopically enriched element or compound is the numeric value specified. Thus, for example, the phrase "enriched from the natural abundance concentration level for $^{70}$Ge in $GeF_4$ to a higher concentration level of 40 percent, means that $^{70}$Ge is present in an amount of 40 atomic % in the isotopically enriched $GeF_4$. If otherwise specified than with reference to the terms "by" or "to" in phraseology such as the foregoing, reference to isotopic concentrations or levels will be understood to refer to atomic percent concentration of the isotopically enriched element or compound having the specific identified numeric value.

In various embodiments, the beneficial isotope may be increased to a major portion of the total isotopes in the composition, i.e., an isotopic concentration greater than 50% in the composition. For example, the mass 72 germanium isotope in germanium tetrafluoride and germane in specific embodiments may be enriched to ≥52% and >27.3%, respectively. In other specific embodiments, the mass 70 germanium isotope in germanium tetrafluoride or germane may be enriched to >21.2%.

Accordingly, germanium tetrafluoride enriched in mass 72 germanium isotope may be advantageously enriched to levels of from at least 52% up to 100%, or to enrichment levels in other specified ranges, such as from 55% to 100%, from 60% to 90%, from 75 to 95%, from 80% to 100% or other permutations of such ranges including one of such lower limits and another of such upper limits, in which a desired level of increase in beam current, enhancement in throughput and/or improved economic character of the implantation operation is achieved. Germane enriched in mass 72 germanium isotope may be advantageously enriched to levels of from above 27.3% up to 100%, or to enrichment levels in other specified ranges, such as from 30% to 100%, from 35% to 85%, from 40% to 60%, from 50% to 99%, from 75-95%, or other permutations of such ranges including one of such lower limits and another of such upper limits, in which the desired improvement in the aforementioned process characteristics of beam current, throughput and cost is achieved.

Correspondingly, germanium tetrafluoride enriched in mass 70 germanium isotope may be advantageously enriched to levels of from greater than 21.2% to 100% or to enrichment levels in other specified ranges, such as from 45% to 100%, from 50% to 99%, from 60% to 85%, from 75% to 98%, or other permutations of such ranges including one of such lower limits and another of such upper limits, achieving the desired level of enhancement in beam current, throughput and cost. Corresponding use of germane enriched in mass 70 germanium isotope may be employed, wherein the enrichment of $^{70}$Ge is to levels of from greater than 21.2% to 100%, or to enrichment levels in other ranges, such as from 25% to 100%, from 30% to 99%, from 40% to 95%, from 50% to 90%, from 75% to 95%, from 80% to 99%, or other permutations of such ranges including one of such lower limits and another of such upper limits, as may be appropriate to the specific ion implantation operation and apparatus in which the isotopically enriched dopant gas is used.

The present disclosure therefore contemplates the achievement of improved lifetime and performance of an ion source in an ion implantation system, by using dopant gases and/or supplemental gases that have been isotopically enriched to levels heretofore unknown in ion implantation. The dopant gas may be isotopically enriched beyond natural abundance, or the co-species gas when present may be isotopically enriched beyond natural abundance, or both the dopant gas and the co-species gas may be isotopically enriched beyond natural abundance. All combinations of isotopic enrichment beyond natural abundance, involving dopant gases, co-species gases, and diluent gases, are contemplated as being within the scope of the present disclosure.

Examples of dopant gas mixtures that may be usefully employed in the practice of the present disclosure to improve lifetime and performance of an ion source include, without limitation, dopant gas compositions comprising:
(1) isotopically enriched germanium tetrafluoride, in combination with xenon and hydrogen as diluent gases;
(2) isotopically enriched germanium tetrafluoride, in combination with germane as a co-species gas;
(3) isotopically enriched germanium tetrafluoride in combination with isotopically enriched germane as a co-species gas;
(4) isotopically enriched boron trifluoride, in combination with xenon and hydrogen as diluent gases;
(5) isotopically enriched boron trifluoride, in combination with diborane as a co-species gas; or
(6) isotopically enriched boron trifluoride, in combination with isotopically enriched diborane as a co-species gas.

In one specific embodiment, the dopant gas mixture includes atomic mass 72 germanium having concentration of more than 55%, e.g., more than 60%, 70%, 80%, or 90%, based on the total isotopic species of germanium that are present, to provide a high level of beam current, improving both throughput and source life.

In another specific embodiment, wherein the dopant gas mixture does not comprise germanium tetrafluoride, the dopant gas mixture includes atomic mass 72 germanium having concentration of more than 25%, e.g., more than 30%, 40%, 50%, 60%, 70%, 80%, or 90%, based on the total isotopic species of germanium that are present, to provide a high level of beam current, improving both throughput and source life.

In still another specific embodiment, the dopant gas mixture includes atomic mass 70 germanium having concentration of more than 25%, e.g., more than 30%, 40%, 50%, 60%, 70%, 80%, or 90%, based on the total isotopic species of germanium that are present, to provide high levels of beam current, and corresponding increases in throughput and source life.

Dopant gas compositions in specific embodiments of the disclosure can comprise a germanium-containing dopant gas and optionally a supplemental gas, wherein the supplemental gas includes at least one of a diluent gas and a co-species gas, and the dopant gas composition is isotopically enriched in at least one Ge isotopic species. Such compositions may in specific embodiments include isotopically enriched germane, or alternatively isotopically enriched germanium tetrafluoride, or alternatively both isotopically enriched germane and germanium tetrafluoride, or alternatively both germane and germanium tetrafluoride wherein only one of such germanium-containing components is isotopically enriched. In other embodiments, when germanium tetrafluoride is present in an isotopically enriched form, the dopant gas composition may include germanium tetrafluoride isotopically enriched in germanium of mass 70, 72, 73, 74 or 76. Other embodiments may include germanium tetrafluoride isotopically enriched in germanium of mass 70, 73 or 74. Still other embodiments may include germanium tetrafluoride isotopically enriched in germanium of mass 70, 72 or 74. In some embodiments, when germanium of mass 72 is present in germanium tetrafluoride, the isotopic enrichment of such mass 72 isotope may be greater than 51.6%, e.g., greater than 52%, 55%, 60%, 65%, 70%, 75%, 80%, 85%, 90%, 95%, 99%, 99.9% or 99.99% in specific implementations, and isotopic enrichment from any of such numeric values of to 100% is contemplated within the broad scope of the present disclosure.

Dopant gas compositions in other embodiments may include a germanium-containing component, such as germane and/or germanium tetrafluoride, in mixture with one or more of argon, helium, hydrogen, nitrogen, ammonia and xenon, wherein the germanium-containing component optionally is isotopically enriched, e.g., in germanium of mass 70, 72, 73, 74 or 76. In one embodiment, the dopant gas composition includes germanium tetrafluoride and ammonia, wherein the germanium tetrafluoride is isotopically enriched, e.g. in germanium of mass 70, 72, 73, 74 or 76, and in another embodiment, wherein the germanium tetrafluoride is isotopically enriched in germanium of mass 72, the isotopic enrichment of such mass 72 isotope may be greater than 51.6%, e.g., greater than 52%, 55%, 60%, 65%, 70%, 75%, 80%, 85%, 90%, 95%, 99%, 99.9% or 99.99% in specific implementations, and isotopic enrichment from any of such numeric values of to 100% is contemplated within the broad scope of the present disclosure.

In one illustrative embodiment, the disclosure relates to an ion implantation process, wherein a dopant gas mixture comprising a dopant gas and optionally a supplemental gas is provided to an ion source for generation of ionic dopant species for implantation, wherein the supplemental gas includes at least one of a diluent gas and a co-species gas, and wherein at least one of the dopant gas and, when present, the supplemental gas, includes an isotopically enriched component.

In another embodiment, the disclosure relates to improving performance and lifetime of an ion source arranged to generate ionic doping species for ion implantation from a dopant gas, comprising using a dopant gas mixture comprising a dopant gas and optionally a supplemental gas, wherein the supplemental gas includes at least one of a diluent gas and a co-species gas, and wherein at least one of the dopant gas and, when present, the supplemental gas, includes an isotopically enriched component.

A further embodiment of the invention relates to an ion implantation system, comprising a dopant gas source and an optional supplemental gas source, wherein each of the gas sources is arranged for dispensing respective dopant gas and supplemental gas to a mixing locus in the system adapted for mixing of the dopant gas and supplemental gas to form a dopant gas mixture, and an ion source constituting the mixing locus or arranged to receive the dopant gas mixture from the mixing locus, wherein the supplemental gas includes at least one of a diluent gas and a co-species gas, and wherein at least one of the dopant gas and, when present, the supplemental gas includes an isotopically enriched component. Thus, the dopant gas mixture can comprise a dopant gas and a supplemental gas, wherein both the dopant gas and the supplemental gas include an isotopically enriched component (e.g., beneficial/desired isotope), or the dopant gas and the supplemental gas can both be isotopically enriched in different isotopic components.

Additional embodiments of the disclosure relate to use of isotopic mass 70 germanium dopant gas and/or co-species gas usage in ion implantation, wherein the dopant gas and/or co-species gas is isotopically enriched in atomic mass 70 germanium beyond natural abundance level, e.g., a level of at least 30%, 35%, 40%, 45%, 50%, 55%, 60%, 65%, 70%, 75%, 80%, 85%, 90%, 95%, 99%, 99.5%, 99.99%, or other level appropriate to the specific ion implantation application employed.

An additional embodiment of the disclosure relates to utilization of a dopant gas reagent including a dopant gas and a co-species, wherein the gas may be of a composition as described herein, including isotopically enriched dopant gas and/or co-species gas components.

In a further embodiment, the dopant reagent including the dopant gas and co-species gas is arranged in the ion implantation system to be flowed to the ion source for supply thereof, wherein the dopant gas and the co-species gas are in mixture with one another.

In a further embodiment, the dopant gas and the co-species gas are sequentially flowed to the ion source for ionization therein. Such sequential operation may be conducted in any suitable manner, utilizing equal time-based flows of the respective dopant gas and co-species gas, or alternatively, the respective time-based flows may be different in respect of each other, or otherwise modulated to provide a doped substrate of desired character.

The substrate that is ion implanted with ionic species in accordance with the present disclosure, may be of any suitable type.

The substrate may be silicon, silicon carbide, gallium nitride, or any other suitable substrate composition. Substrates may include microelectronic device substrates, i.e., substrates utilized to prepare microelectronic structures for manufacturing of microelectronic devices or device precursor components.

In other embodiments, the substrate may be implanted for manufacturer of products such as displays and solar panels. It will be recognized that the disclosure is applicable to ion implantation applications of any suitable character.

In one embodiment, the present disclosure relates to a dopant composition supply apparatus including a vessel having an interior volume and a dopant composition in the interior volume, wherein the dopant composition may be of any suitable type as described. Such dopant composition supply apparatus may be arranged for coupling with an ion source, e.g., by means of suitable flow circuitry containing appropriate instrumentation and control components for effecting appropriate flow of dopant composition to the ion source.

Referring now to the drawings, FIG. 1 is a schematic representation of an ion implant process system according to one aspect of the disclosure.

The ion implant process system 300 includes a storage and dispensing vessel 302 containing having an interior volume holding a dopant gas that is supplied for ion implantation doping of a substrate 328 in the illustrated ion implant chamber 301. The storage and dispensing vessel may be of a type containing a sorbent medium on which the dopant gas is physically adsorbed for storage of the gas, with the gas being desorbed from the sorbent medium, under dispensing conditions, for discharge from the vessel. The sorbent medium may be a solid-phase carbon adsorbent material. Sorbent-based vessels of such type are commercially available from ATMI, Inc. (Danbury, Conn., USA) under the trademarks SDS and SAGE. Alternatively, the vessel may be of an internally pressure-regulated type, containing one or more pressure regulators in the interior volume of the vessel. Such pressure-regulated vessels are commercially available from ATMI, Inc. (Danbury, Conn., USA) under the trademark VAC. As a still further alternative, the vessel may contain the dopant source material in a solid form that is volatilized, e.g., by heating of the vessel and/or its contents, to generate the dopant gas as a vaporization or sublimation product. Solid delivery vessels of such type are commercially available from ATMI, Inc. (Danbury, Conn., USA) under the trademark ProEvap.

In FIG. 1, the storage and dispensing vessel 302 comprises a cylindrical vessel wall 304 enclosing an interior volume holding the dopant gas in an adsorbed state, a free gas state, or a liquefied gas state.

The storage and dispensing vessel 302 includes a valve head 308 coupled in gas flow communication via a dispensing line 372 with a mixing chamber 360 (which is optional), joined in turn to discharge line 312. A pressure sensor 310 may be disposed in the line 312, together with a mass flow controller 314; other optional monitoring and sensing components may be coupled with the line, and interfaced with control means such as actuators, feedback and computer control systems, cycle timers, etc.

The mixing chamber 360 also if used may be joined in flow communication with gas feed line 370, to which are coupled supplemental gas supply vessels 362 and 364, each of which may be of a same or different type relative to one another, and which may be of a same or different type in relation to vessel 302 above described. Vessel 362 may for example contain a diluent gas, and vessel 364 may for example contain a co-species gas, arranged so that dopant gas mixtures can be prepared, containing the dopant gas in combination with the diluent gas and/or the co-species gas.

Supplemental vessel 362 is formed with a main container portion to which is secured a valve head 380 that is in turn coupled with supplemental vessel feed line 366. In like manner, supplemental vessel 364 is formed with a main container portion to which is secured valve head 382. Valve head 382 is coupled to supplemental vessel feed line 368. Feed lines 366 and 368 by such arrangement deliver diluent and/or co-species gas(es) to the mixing chamber 360, to provide a dopant gas mixture containing diluent and/or co-species gas(es), for passage to the ion source of the implanter. For such purpose, the supplemental vessel feed lines 366 and 368, and dispensing line 372 may be equipped with suitable valves, controllers and/or sensors for manually or automatically controlling the flow or other characteristics of the materials dispensed from the vessels and such valves, controllers and/or sensors can be coupled with or connected to the corresponding feed/dispensing lines in any suitable manner.

Such valves may in turn be coupled with valve actuators operatively linked to a central processor unit (CPU). The CPU may be coupled in signal communication relationship with the aforementioned controllers and/or sensors, and programmably arranged to control the rates, conditions and amounts of fluids dispensed from each of the vessels in relation to each other, so that the dopant gas mixture flowed from the mixing chamber 360 in line 312 has a desired composition, temperature, pressure and flow rate for carrying out the ion implantation operation.

In the illustrated system 300, the ion implant chamber 301 contains an ion source 316 receiving the dispensed dopant gas mixture from line 312 and generates an ion beam 305. The ion beam 305 passes through the mass analyzer unit 322 which selects the ions needed and rejects the non-selected ions.

The selected ions pass through the acceleration electrode array 324 and then the deflection electrodes 326. The resulting focused ion beam is impinged on the substrate element 328 disposed on the rotatable holder 330 mounted on spindle 332. The ion beam of dopant ions is used to dope the substrate as desired to form a doped structure.

The respective sections of the ion implant chamber 301 are exhausted through lines 318, 340 and 344 by means of pumps 320, 342 and 346, respectively.

Figure 2:
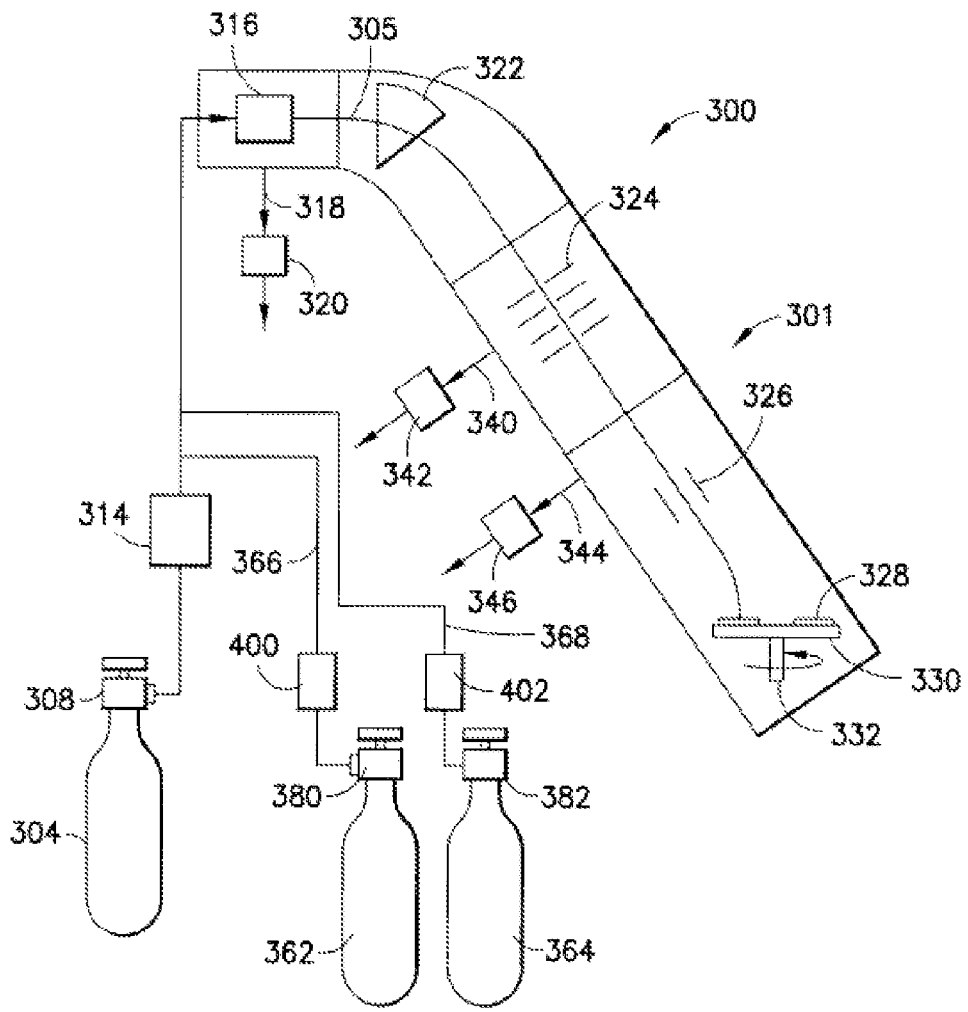
FIG. 2 is a schematic representation of an ion implant process system according to another aspect of the disclosure.

FIG. 2. is a schematic representation of an ion implant process system according to another aspect of the disclosure. The FIG. 2 system is numbered correspondingly with respect to the same components and features of FIG. 1 but the FIG. 2 system utilizes the respective dopant gas and supplemental gas vessels in a flow circuitry arrangement wherein each of the vessels 304, 362 and 364 has a separate mass flow controller 314, 400 and 402, respectively, in its dispensing line. By this arrangement, the flow of gas from each of the respective vessels is modulated by a dedicated mass flow controller in the associated dispensing line, to achieve selected flow rates or flow rate ratios of the respective gases in operation. The respective mass flow controllers may be operatively linked with a central processor unit (CPU) by which the respective mass flow controllers can be adjusted in operation as necessary or desirable to achieve optimal operation of the system.

In a further aspect of the present disclosure, the dopant gas may be supplied in the first instance in a mixture containing one or more supplemental gas(es), i.e., a diluent and/or co-species gas, in which the mixture of dopant gas and supplemental gas is contained in a single supply vessel, from which the gas mixture can be dispensed and flowed to the ion source of the ion implantation system. For example, in the FIG. 1 system, the vessel 302 can constitute a single gas supply vessel (with supplemental vessels 362 and 364 being absent) containing the dopant gas and supplemental gas mixture.

Such approach may be utilized to provide germane as a dopant gas in a mixture comprising hydrogen, an inert gas or other diluent gas, as a co-packaged mixture that can be provided from a single supply vessel. This is a safer packaging technique as compared to high pressure 100% germane, and enables germane to be used as an alternative to germanium tetrafluoride, since germanium tetrafluoride can in some ion implant applications cause problems with respect to source life and turbo pump life that are avoided by the use of germane.

As an illustrative example of germane gas mixtures that can be advantageously used in the broad practice of the present disclosure, as provided in a single supply vessel, the germane-containing gas composition can comprise from 5 to 35 volume % germane, based on the total volume of the composition, or other suitable concentration of germane, with the balance being one or more of hydrogen, argon, nitrogen, and helium, wherein the germane is either natural abundance germane, or germane that is isotopically enriched in $^{70}$Ge or $^{72}$Ge or other germanium isotope, or wherein the dopant gas mixture containing germane is optionally otherwise isotopically enriched in at least one Ge isotopic species.

In another aspect, the present disclosure relates to use of ammonia as a co-flow gas with germanium tetrafluoride, to increase source life in ion implantation systems in which germanium tetrafluoride is used as a dopant gas, and wherein the germanium tetrafluoride optionally may be isotopically enriched in at least one Ge isotopic species. By using ammonia as a supplemental gas in mixture with germanium tetrafluoride when implanting germanium, the nitrogen and hydrogen constituents of ammonia ($NH_3$) will effectively scavenge fluorine from the germanium tetrafluoride. As a result of such fluorine scavenging, the $GeF_4/NH_3$ mixture will at least partially inhibit the halogen cycle within the ion source that results in poor source life due to tungsten whiskers growing on the arc slit and/or tungsten depositing on the cathode and/or anticathode.

Such usage of ammonia as a co-flow gas with $GeF_4$ can be effected in any of a variety of arrangements. In one embodiment, separate gas supply vessels for ammonia and germanium tetrafluoride are employed, and the gases from the respective gas supply vessels are co-flowed to the ion source. The co-flowed gases may be mixed prior to passage through a mass flow controller, or mixed between a mass flow controller and the ion source, or mixed within the ion source.

Alternatively, a single supply vessel containing a mixture of ammonia and germanium tetrafluoride, in any suitable relative proportions, can be provided.

As a further alternative, xenon can be provided as a supplemental gas in a separate supply vessel. After being dispensed from the supply vessel, the xenon can be mixed with ammonia and/or germanium tetrafluoride. Xenon can also be provided as a supplemental gas in a gas vessel containing xenon mixed with ammonia and/or germanium tetrafluoride. The presence of xenon in the gas introduced to the ion source improves source life by the sputtering effect of the xenon on the cathode, to remove any excess tungsten that deposits on such cathode.

The disclosure in yet another aspect relates to an improved ion implantation process that comprises, consists essentially of, or consists of flowing one or more isotopically enriched dopant material, such as for example germane or germanium tetrafluoride, into an ionizing chamber to generate ionic dopant species, extracting the ionic dopant species from the ionizing chamber, selecting a predetermined ionic dopant species and implanting the selected/desired ionic dopant species into a microelectronic or semiconductor substrate.

In various embodiments, the beneficial/desired isotope may be increased, relative to natural abundance concentration, by an amount of 5, 10, 15, 20, 25, 30, 35, 40, 45, 50, 55, 60 or more percent above the natural abundance concentration level of such isotope, or the beneficial/desired isotope may be enriched from the natural abundance concentration level to a higher concentration level such as 10, 20, 30, 40, 50, 60, 70, 80, 90 or more percent, depending on the natural abundance level of the specific isotopic species involved. The enrichment of a desired germanium isotope is provided to increase the abundance or concentration of such isotope and correspondingly increase the quantity of the isotope in the ion beam. This in turn yields a corresponding advantage in throughput as compared with systems and/or processes that utilize a germanium source containing a lower concentration/amount of the same/desired germanium isotope.

In one preferred embodiment, a germanium tetrafluoride gas containing ≥52% atomic mass 72 germanium isotope, a germane gas containing >27.3% atomic mass 72 germanium isotope, or a mixture of both gases is used as the dopant material. In another preferred embodiment, a germanium tetrafluoride gas containing ≥21.2% atomic mass 70 germanium isotope, a germane gas containing >21.2% atomic mass 70 germanium isotope, or a mixture of both gases is used as the dopant material.

In dopant gas compositions comprising a germanium-containing dopant gas and optionally a supplemental gas, wherein the supplemental gas includes at least one of the diluent gas and a co-species gas, and the dopant gas composition is isotopically enriched in at least one Ge isotopic species, the composition may comprise at least one of germane and germanium tetrafluoride, in which either or both of such components is isotopically enriched, e.g., in germanium of mass 70, 72, 73, 74 or 76, or alternatively in germanium of mass 70, 72 or 74. In such composition, when germanium tetrafluoride is present and is isotopically enriched in germanium of mass 72, the isotopic enrichment level may be greater than 51.6%. The dopant gas composition may include a supplemental gas of any suitable character.

Dopant gas compositions are contemplated that comprise a germanium-containing component and one or more of argon, helium, hydrogen, nitrogen, ammonia and xenon, wherein the germanium-containing component optionally is isotopically enriched. The germanium-containing component in specific embodiments may comprise germane and/or germanium tetrafluoride. The dopant gas composition in a specific embodiment may comprise ammonia. In other embodiments, the composition may for example consist of germanium tetrafluoride and ammonia, in which the germanium tetrafluoride is isotopically enriched. Alternatively, the composition may comprise isotopically enriched germanium tetrafluoride and at least one of ammonia and xenon.

A further aspect of the disclosure relates to sequential flow of dopant materials, in which cathode bias power is monitored during operation of the ion source and the monitored cathode biased source power is utilized in a feedback control process for controlling/selecting/alternating between respective ones of the dopant compounds delivered to the ion source, in order to extend the operating lifetime of the ion source or its components, e.g., by maintaining a predetermined cathode bias power in the operation of the ion source. Such method can be utilized to repair or remediate the cathode of the ion source, i.e., to effect regrowth or etching of the cathode, as required to maintain or otherwise achieve a predetermined cathode bias power in the operation of the ion source.

The ion source may be of any suitable type in such monitored and controlled process, e.g., an indirect hot cathode (IHC) ion source. Cathode bias power in such method is advantageously used as a feedback mechanism to control sequential flow of different dopant compounds to extend the operating lifetime of the ion source/cathode.

The different dopant compounds may be, and preferably are, dopant compounds for the same dopant species, e.g., germanium tetrafluoride and germane as dopant compounds for the dopant species germanium. Such different dopant source compounds may include at least one that is isotopically enriched, as variously described herein.

This method of operating an ion implantation system including a cathode in an arc chamber of an ion source, to maintain operating efficiency of the ion source, in one embodiment includes contacting the cathode with sequentially supplied dopant compositions, while measuring cathode bias power, and in response to the measured cathode bias power, modulating at least one of said sequentially supplied dopant compositions, to extend operating lifetime of the ion source, cathode and/or one or more other components of the ion source.

The term "modulating" in reference to the sequentially supplied dopant compositions, means that the sequence, duration, process conditions, or dopant composition selection for at least one of the sequentially supplied dopant compositions is controlled, i.e., selectively varied, in response to the measured cathode bias power. Thus, the supply periods for each of the dopant compositions may be varied in relation to one another, to maintain a set point cathode bias power value, or one dopant composition may be supplied at higher voltage conditions than another, or the feedback monitoring and control system may be arranged to otherwise control/select/alternate between the respective dopant compositions.

In another embodiment, the method may be utilized to flow concurrently or sequentially a cleaning agent or a deposition agent through the ion source, in relation to one or more dopant compositions, wherein the cathode bias power or other power utilization variable of the ion source is utilized to effect etching of the cathode to remove deposits therefrom, e.g., if the monitored power usage increases above an initial or other predetermined or setpoint value or level, by flowing and etch cleaning agent through the ion source, and/or wherein the cathode bias power or other power utilization variable of the ion source is utilized to effect regrowth of cathode material by flow of a deposition agent therefor through the ion source, if the monitored power usage decreases below an initial or other predetermined or setpoint value.

It will therefore be appreciated that the compositions, processes, methods, apparatus and systems of the disclosure are susceptible to implementation and application in a wide variety of manners, to provide corresponding improvements in performance and lifetime of an ion source in an ion implantation system.

While the disclosure has been has been set out herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present invention, based on the description herein. Correspondingly, the invention as hereinafter claimed is intended to be broadly construed and interpreted, as including all such variations, modifications and alternative embodiments, within its spirit and scope.

What is claimed is:

1. A packaged gas mixture for use in ion implantation, comprising a gas storage and dispensing vessel containing a gas mixture comprising dopant gas and supplemental gas, wherein the supplemental gas includes at least one of a diluent gas and a co-species gas, and wherein at least one of the dopant gas and, when present, a co-species gas, is isotopically enriched above natural abundance level in at least one isotope.

2. The packaged gas mixture of claim 1, wherein the gas mixture comprises a diluent gas.

3. The packaged gas mixture of claim 1, wherein the gas mixture comprises a co-species gas.

4. The packaged gas mixture of claim 1, wherein the gas mixture comprises a diluent gas and a co-species gas.

5. The packaged gas mixture of claim 1, wherein the gas mixture comprises dopant gas comprising a dopant species selected from the group consisting of germanium, boron, silicon, phosphorus, and arsenic.

6. The packaged gas mixture of claim 1, wherein the gas mixture comprises dopant gas selected from the group consisting of germanium tetrafluoride, germane, boron trifluoride, diborane, silicon tetrafluoride, silane, phosphine, and arsine.

7. The packaged gas mixture of claim 1, wherein the dopant gas comprises a dopant species that is coordinated or associated to a non-dopant component selected from the group consisting of hydride, halide, and organo components.

8. The packaged gas mixture of claim 1, wherein the gas mixture comprises at least one gas selected from the group consisting of argon, fluorine, nitrogen, helium, ammonia, xenon, hydrogen, and germane.

9. The packaged gas mixture of claim 1, wherein the dopant gas comprises germanium tetrafluoride.

10. The packaged gas mixture of claim 1, wherein the dopant gas comprises germane.

11. The packaged gas mixture of claim 1, wherein the dopant gas comprises boron trifluoride.

12. The packaged gas mixture of claim 1, wherein the dopant gas comprises diborane.

13. The packaged gas mixture of claim 1, wherein the dopant gas comprises silicon tetrafluoride.

14. The packaged gas mixture of claim 1, wherein the dopant gas comprises silane.

15. The packaged gas mixture of claim 1, wherein the dopant gas comprises phosphine.

16. The packaged gas mixture of claim 1, wherein the dopant gas comprises arsine.

17. The packaged gas mixture of claim 1, wherein the gas mixture comprises germanium tetrafluoride and xenon.

18. The packaged gas mixture of claim 1, wherein the gas mixture comprises germanium tetrafluoride and hydrogen.

19. The packaged gas mixture of claim 1, wherein the gas mixture comprises germanium tetrafluoride, xenon, and hydrogen.

20. The packaged gas mixture of claim 1, wherein the gas mixture comprises germanium tetrafluoride and germane.

21. The packaged gas mixture of claim 1, wherein the gas mixture comprises boron trifluoride and xenon.

22. The packaged gas mixture of claim 1, wherein the gas mixture comprises boron trifluoride and hydrogen.

23. The packaged gas mixture of claim 1, wherein the gas mixture comprises boron trifluoride and diborane.

24. A method for enhancing operation of an ion implantation system, comprising providing for use in the ion implantation system the packaged gas mixture of claim 1.

25. An ion implantation process, comprising:
flowing to an ion source a gas mixture from a packaged gas mixture according to claim 1;
generating ionic dopant species from the gas mixture at the ion source; and
implanting the ionic dopant species in a substrate.

* * * * *